(12) United States Patent  
Okamoto et al.

(10) Patent No.: US 8,183,656 B2  
(45) Date of Patent: May 22, 2012

(54) PHOTODIODE

(75) Inventors: Daisuke Okamoto, Minato-ku (JP);  
Junichi Fujikata, Minato-ku (JP);  
Kenichi Nishi, Minato-ku (JP); Keishi Ohashi, Minato-ku (JP)

(73) Assignee: NEC Corporation, Tokyo (JP)

( * ) Notice: Subject to any disclaimer, the term of this patent is extended or adjusted under 35 U.S.C. 154(b) by 134 days.

(21) Appl. No.: 12/518,729

(22) PCT Filed: Dec. 13, 2007

(86) PCT No.: PCT/JP2007/074007  
§ 371 (c)(1),  
(2), (4) Date: Jun. 11, 2009

(87) PCT Pub. No.: WO2008/072688  
PCT Pub. Date: Jun. 19, 2008

(65) Prior Publication Data  
US 2010/0013040 A1 Jan. 21, 2010

(30) Foreign Application Priority Data  
Dec. 14, 2006 (JP) ................................. 2006-337035

(51) Int. Cl.  
*H01L 31/322* (2006.01)

(52) U.S. Cl. .. 257/432; 257/431; 257/436; 257/E31.127

(58) Field of Classification Search ................. 257/432, 257/E32.127, 431, 436, 449, 458  
See application file for complete search history.

(56) References Cited

U.S. PATENT DOCUMENTS 5,185,272 A * 2/1993 Makiuchi et al. ............... 438/59  
2003/0129813 A1* 7/2003 Lu et al. ........................ 438/571

FOREIGN PATENT DOCUMENTS

| EP | 0 651 448 A1 | 5/1995 |
| JP | 02-199877 A | 8/1990 |
| JP | 03-080573 A | 4/1991 |
| JP | 04-207086 A | 7/1992 |
| JP | 09-023022 A | 1/1997 |
| JP | 10-190147 A | 7/1998 |

(Continued)

OTHER PUBLICATIONS

Daisuke Okamoto, et al., "One-dimensional Plasmonic Antenna Enhanced Nano-Photodiode for Optical Communication (1 Jigen Plasmon Antenna o Mochiita Hikari Tsushin Hachotai Nano Photodiode)", Abstracts of 67th Annual Meeting, Japan Society of Applied Physics, 2006, p. 938, vol. 3, 30A-T-13.

(Continued)

*Primary Examiner* — Cuong Q Nguyen  
*Assistant Examiner* — Tran Tran  
(74) *Attorney, Agent, or Firm* — Sughrue Mion, PLLC

(57) ABSTRACT

A photodiode includes: an upper spacer layer including a semiconductor transparent to incident light; a metal periodic structure provided on the upper spacer layer and arranged to induce surface plasmon, the metal periodic structure including first and second electrodes including portions arranged alternately on the upper spacer layer; a light absorption layer formed under the upper spacer layer and including a semiconductor having a refractive index higher than that of the upper spacer layer; and a lower spacer layer formed under the light absorption layer and having a refractive index smaller than that of the light absorption layer. Each of the first and second electrodes forms a Schottky barrier junction with the upper spacer layer.

17 Claims, 6 Drawing Sheets

FOREIGN PATENT DOCUMENTS

| | | |
|---|---|---|
| JP | 10-509806 A | 9/1998 |
| WO | 96/05536 A2 | 2/1996 |
| WO | 2004/012275 A2 | 2/2004 |

OTHER PUBLICATIONS

David Crouse, et al., "A method for designing electromagnetic resonance enhanced silicon-on-insulator metal-semiconductor-metal photodetectors", J. Opt. A: Pure Appl. Opt., 2006, pp. 175-181, vol. 8.

David Okamoto, et al., Highly efficient nano-photodiode enhanced by a surface-plasmon antenna and a distributed Bragg reflector (Plasmon antenna to Bragg Mirror o Kumiawaseta Kokoritsu Nano Photodiode), Abstracts of 68th Annual Meeting, Japan Society of Applied Physics, 2007, p. 1047, vol. 3, 8p-Q-2.

* cited by examiner

INCIDENT LIGHT

PHOTODIODE

TECHNICAL FIELD

The present invention relates to a semiconductor light receiving device, and more particularly to a photodiode which can convert an optical signal including infrared light, visible light, and ultraviolet light into an electrical signal.

BACKGROUND ART

In order to convert an optical signal into an electrical signal at high speed and with high efficiency, photodiodes using a photoelectric conversion phenomenon in a semiconductor are widely used. The photodiodes are used, for example, in the field of communication and the field of information processing, for the purpose of converting an optical signal including infrared light, visible light, and ultraviolet light into an electrical signal. The photodiodes are classified into a pn type, a pin type, a Schottky barrier type, an MSM (metal-semiconductor-metal) type, and so forth on the basis of their structure. The principal factors that limit the response speed of the photoelectric conversion of a photodiode are: a circuit time constant that is determined by a product of load resistance connected to the photodiode and electrical capacitance created by a depletion layer in the photodiode; and a carrier transit time needed for carriers to pass through the depletion layer. Thus, in order to improve fast response of the photodiode, either the circuit time constant should be reduced or the carrier transit time should be shortened.

One of photodiodes capable of fast response includes an MSM type, and is expected as a photoelectric conversion device used in the fields of communication and information processing. The MSM photodiode is a type of Schottky barrier photodiode. In the MSM photodiode, a pair of electrodes are disposed on a surface of a semiconductor layer functioning as a light absorption layer, and a Schottky barrier is formed in the vicinity of each of the two electrodes. Japanese Patent Application Laid-Open No. 7-153989 (JP-A-7-153989), which corresponds to EP 0651448 A1, discloses an example of a typical MSM photodiode. In the MSM photodiode, by using two electrodes each having a comb-like structure and arranging these electrodes in an interdigitated manner, a high electric field can be applied to the light absorbing layer even if a voltage applied to the photodiode is low and the carrier transit time can be thus shortened, thereby achieving a relatively fast response speed. On the other hand, there is a problem that because the incident light is reflected by the electrodes disposed on a light receiving surface, the quantum efficiency decreases. In addition, there exists a trade-off relationship where, if the carrier transit time is shortened by thinning the light absorbing layer in order to attain fast response, this causes a drop in efficiency.

In recent years, various attempts have been made to further increase the operation speed of the MSM photodiode and further increase the quantum efficiency thereof through the use of a metal surface plasma phenomenon.

For example, Japanese Patent Application Laid-Open No. 10-509806 (JP-A-10-509806), which corresponds to WO96/05536, discloses a photoelectric coupler in which the surface plasmon phenomenon is used. In this photoelectric coupler, a device configuration is employed in which interdigital metal electrodes aligned with regular spacing are arranged on a semiconductor substrate such that positive electrodes and negative electrodes confront each other with one fitting into the other. In addition, JP-A-10-509806 (WO96/05536) describes an MSM photodiode in which incident light and surface plasmon are coupled with each other by resonance, and also describes that a diffraction wave generated by a metal electrode is coupled with a local wave and confined in a waveguide. However, this literature does not describe a structure of a metal electrode which efficiently generates a diffracted light by surface plasmon resonance. Moreover, as for a method for coupling a diffracted light to a waveguide formed by a light absorbing layer, the wave number matching condition alone is disclosed, but neither a waveguide structure for improving coupling efficiency nor a positional relationship with the metal electrode has been described. Therefore, in the MSM photodiode disclosed in JP-A-10-509806 (WO96/05536), the efficiency of generating a diffracted light of a desired order is low, and the coupling efficiency of the diffracted light to the waveguide formed by the light absorbing layer is low, thereby lowering the quantum efficiency.

Japanese Patent Application Laid-Open No. 2006-501638 (JP-A-2006-501638) corresponding to WO2004/012275 discloses an MSM photodiode which has a cavity structure formed by installing a Bragg reflection mirror below a light absorbing layer and using an electrode as a top mirror, and can improve efficiency even if the thickness of a light absorbing layer is small by confining a zero-order transmitted light within this cavity structure. However, in this MSM photodiode, the Q value of the cavity needs to be increased in order to achieve sufficient efficiency, but it is inherently difficult to make light incident into the cavity having a high Q value, and the incident light is reflected by the electrode functioning as the top mirror of the cavity before it enters the cavity. As a result, with this configuration, it is difficult to achieve sufficient quantum efficiency.

Japanese Patent Application Laid-Open No. 9-023022 (JP-A-9-023022) discloses a photoelectric conversion device which has an optical waveguide formed by sandwiching a multiple-quantum well layer as a core layer between upper and lower cladding layers, and allows the multiple-quantum well layer to absorb light. However, JP-A-9-023022 does not describe the improvement of the efficiency of an MSM photodiode using a diffracted light.

SUMMARY OF INVENTION

Technical Problem

As described above, an MSM light receiving device or photodiode that does not use surface plasmon resonance has a problem that quantum efficiency is not high due to reflection by a metal electrode, and the improvement of quantum efficiency and the improvement of response speed are in a trade-off relationship. In addition, an MSM photodiode that promotes high efficiency by coupling a diffracted light to an optical waveguide also has a problem that the mere combination of a metal electrode and an optical waveguide leads to a low efficiency of generation of diffracted light and a poor coupling efficiency between diffracted light and an optical waveguide, thus making it impossible to achieve sufficient quantum efficiency.

Therefore, it is an object of the present invention to provide an MSM (metal-semiconductor-metal) photodiode which realizes a high quantum efficiency even with a thin light absorbing layer and achieves both higher efficiency and higher response speed by reducing reflection caused by a metal electrode and efficiently generating a diffracted light.

Solution to Problem

According to an exemplary embodiment of the present invention, a photodiode comprises: an upper spacer layer comprising a semiconductor transparent to incident light; a metal periodic structure provided on the upper spacer layer and arranged to induce surface plasmon, the metal periodic structure including first and second electrodes including portions arranged alternately on the upper spacer layer; a light absorption layer formed under the upper spacer layer and comprising a semiconductor having a refractive index higher than that of the upper spacer layer; and a lower spacer layer formed under the light absorption layer and having a refractive index smaller than that of the light absorption layer. In this photodiode, each of the first and second electrodes form a Schottky barrier junction with the upper spacer layer.

In this photodiode, since the first and second electrodes constituting the metal periodic structure form a Schottky barrier junction with the semiconductor layer forming the upper spacer layer, electrical signals can be obtained from photocarriers generated in the light absorption layer. In addition, incident light is coupled to a surface plasmon propagated along waveguide portions of the metal periodic structure. Here, a decrease in reflection of the incident light is enabled by adjusting the thickness of the metal periodic structure and having a structure in which a cavity of surface plasmon polaritons is formed between the incident end and exit end of the waveguide portions, thereby efficiently guiding the optical energy of the incident light into the semiconductor layer. Accordingly, since reflection from a metal electrode is reduced in this photodiode, a high quantum efficiency can be obtained by coupling a diffracted light to an optical waveguide formed by the light absorption layer even when the light absorption layer is thinned in order to achieve high speed operation, and both high efficiency and high-speed response can be realized in the photodiode.

EXPLANATION OF REFERENCE SIGNS $1a$, $1b$: MSM electrodes;
2: upper spacer layer;
3: light absorption layer;
4: lower spacer layer;
5: substrate;
6: $SiO_2$ film;
7: Ti/Au electrode;
8: InAlAs layer;
9: graded layer;
10: InGaAs layer;
11: InP substrate;
12: Cr/Ag electrode;
13: Si layer;
14: SiGe buffer layer;
15: Ge layer;
16: buried oxide layer;
17: Si substrate;
18: Bragg reflection multilayer film;
19: cutout window;
20: metal mirror;
21: lens;
22: electrical wiring;
23: preamplifier IC;
24: chip-carrier;
25, 34, 39: optical fibers;
26: signal light;
27: photodiode;
28: module housing;
29: LSI package;
30, 32, 33: electrical wiring vias;
31: VCSEL light source;
35, 37: mounting boards;
36: concave mirror; and
38: electrical wiring layer.

DESCRIPTION OF THE EXEMPLARY EMBODIMENTS

Next, exemplary embodiments of the present invention are explained in detail with reference to the accompanying drawings.

First Exemplary Embodiment

Figure 1:
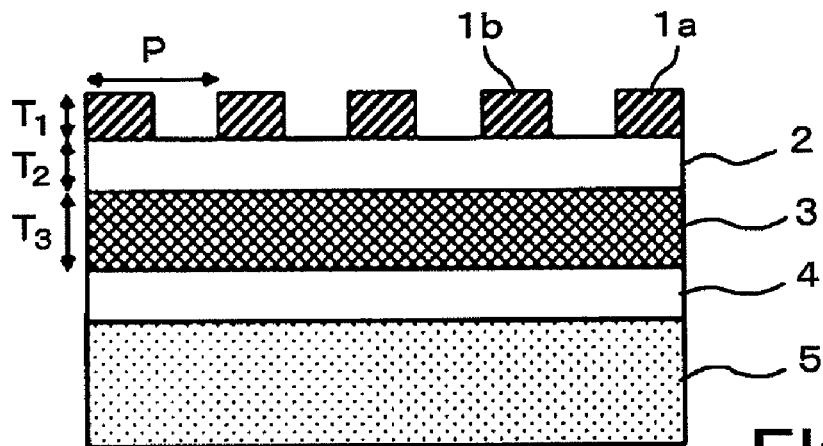
FIG. 1 is a sectional view showing the configuration of an MSM photodiode according to a first exemplary embodiment of the present invention.

FIG. 1 shows a cross-sectional configuration of an MSM (metal-semiconductor-metal) photodiode according to a first exemplary embodiment. In this photodiode, light absorption layer 3, which is a semiconductor layer for generating photocarriers, is formed; upper spacer layer 2 composed of a semiconductor transparent to the incident light is formed on light absorption layer 3; and lower spacer layer 4 is formed under light absorption layer 3. Here, both upper spacer layer 2 and lower spacer layer 4 have a refractive index smaller than that of light absorption layer 3. Lower spacer layer 4 is formed on substrate 5, and substrate 5, lower spacer layer 4, light absorption layer 3 and upper spacer layer 2 are stacked in this order. Lower spacer layer 4, light absorption layer 3 and upper spacer layer 2 constitute an optical waveguide.

A pair of MSM electrodes $1a$, $1b$ constituting a metal periodic structure is formed on the surface of upper spacer layer 2. As described later, MSM electrodes 1a, 1b include portions arranged in an interleaved manner. A Schottky barrier junctions are formed at the positions in which MSM electrodes 1a, 1b contact with upper spacer layer 2. Because of this, light absorption layer 3 becomes a depletion layer, and photocarriers generated from light absorption layer 3, as light currents, are extracted to an external circuit through MSM electrodes 1a, 1b and converted into electrical signals. MSM electrodes 1a, 1b are connected to an external circuit, such as a load resistor, a bias power supply, and so forth.

MSM electrodes 1a, 1b have a periodic structure which is capable of inducing surface plasmon resonance. In the case of the MSM photodiode, generally, MSM electrodes 1a, 1b each having a comb-like structure, and interdigital regions of two MSM electrodes 1a, 1b are alternated, the fingers of two MSM electrodes 1a, 1b are alternately arranged on the surface of upper spacer layer 2. In this case, in the light receiving portion, the electrodes have a slit array structure or a stripe structure. However, MSM electrodes 1a, 1b do not necessarily have to be of the interdigitated structure, but may be of such a structure in which concentric metal electrodes are disposed with one fitting into the other.

As a material for MSM electrodes 1a, 1b, conductive metal is preferably used. Particularly, a material such as silver (Ag) or gold (Au) having little electric resistance and little surface plasmon loss is preferable. By forming MSM electrodes 1a, 1b using metal, MSM electrodes 1a, 1b function as a metal periodic structure at least in the light receiving area. However, the metal constituting MSM electrodes 1a, 1b is not limited to these metals, and, for example, Al or Cu, which are widely used for semiconductor devices and can be processed by various processing techniques, may be used. If the adhesion between the metallic material used for MSM electrodes 1a, 1b and upper spacer layer 2 is poor, a layer of Ti, Ta, Cr, W, Ni, and so on, as an adhesion layer, can be formed under the electrodes. The film thickness of the adhesion layer is particularly preferably equal to or less than 10 nm to reduce optical loss. In addition, an antireflection film or protective film made of an insulating material may be disposed on the surfaces of MSM electrodes 1a, 1b. As material for the antireflection film or protective film, a material such as $SiO_2$, SiON, SiN and so on which make film formation easier and can obtain a stable film is particularly preferable.

As light absorption layer 3, a semiconductor material, such as $Si_xGe_{1-x}$, Ge, or InGaAs, can be used. Further, as upper spacer layer 2, a semiconductor material, such as Si or InAlAs, can be used. The use of such semiconductor materials for upper spacer layer 2 is especially preferable because a good Schottky barrier junction is obtained between the upper spacer layer and MSM electrodes 1a, 1b. Lower spacer layer 4 may be an insulating material, such as $SiO_2$, or may be a semiconductor, such as Si, InAlAs and InP.

Each of upper spacer layer 2, light absorption layer 3 and lower spacer layer 4 may be composed of a structure in which a plurality of semiconductor materials are laminated. As materials constituting these layers 2 to 4, the best materials can be selected according to substrate 5 used to manufacture a photodiode or according to the wavelength of incident light. For example, if Si is used as the material of substrate 5, Si can be used for upper spacer layer 2, SiGe or Ge can be used for light absorption layer 3, and $SiO_2$ can be used for lower spacer layer 4. Further, for example, if InP is used as the material of substrate 5, InAlAs can be used for upper spacer layer 2, InGaAs can be used for light absorption layer 3, and InAlAs can be used for lower spacer layer 4.

In order to increase the quantum efficiency of the photodiode by reducing reflection of incident light on MSM electrodes 1a, 1b to efficiently generate a diffracted light and efficiently coupling this diffracted light to an optical waveguide formed by upper spacer layer 2, light absorption layer 3 and lower spacer layer 4, the period and thickness of MSM electrodes 1a, 1b, the thickness of upper spacer layer 2, the thickness of light absorption layer 3, and so forth become very important parameters. Here, a computational result of electromagnetic field simulation performed by the present inventors will be described in order to obtain optimal values of these parameters and show an improvement in quantum efficiency by providing upper spacer layer 2.

Here, $\lambda$ is the wavelength of incident light in vacuum; $n_1$ is the refractive index of an incident portion; $n_2$ is the refractive index of upper spacer layer 2; $n_3$ is the refractive index of light absorption layer 3; $n_4$ is the refractive index of lower spacer layer 4; P is the period of MSM electrodes 1a, 1b in the light receiving portion; $T_1$ is the thickness of MSM electrodes 1a, 1b; $T_2$ is the thickness of upper spacer layer 2; and $T_3$ is the thickness of light absorption layer 3. When an antireflection film or protective film made of $SiO_2$, $SiO_n$, SiN, and so on is provided, the refractive index $n_1$ of the incident portion indicates the refractive indexes thereof. When there is no such antireflection film or protective film provided, the refractive index $n_1$ of the incident portion indicates the refractive index $n_{air}$ of air ($n_{air} \approx 1$). In addition, the fingers of MSM electrode 1a and the fingers of the other MSM electrode 1b are alternately arranged at regular spacing, and period P refers to the period of arrangement of these electrode fingers in the case it does not matter which MSM electrode the fingers belong to.

Figure 2:
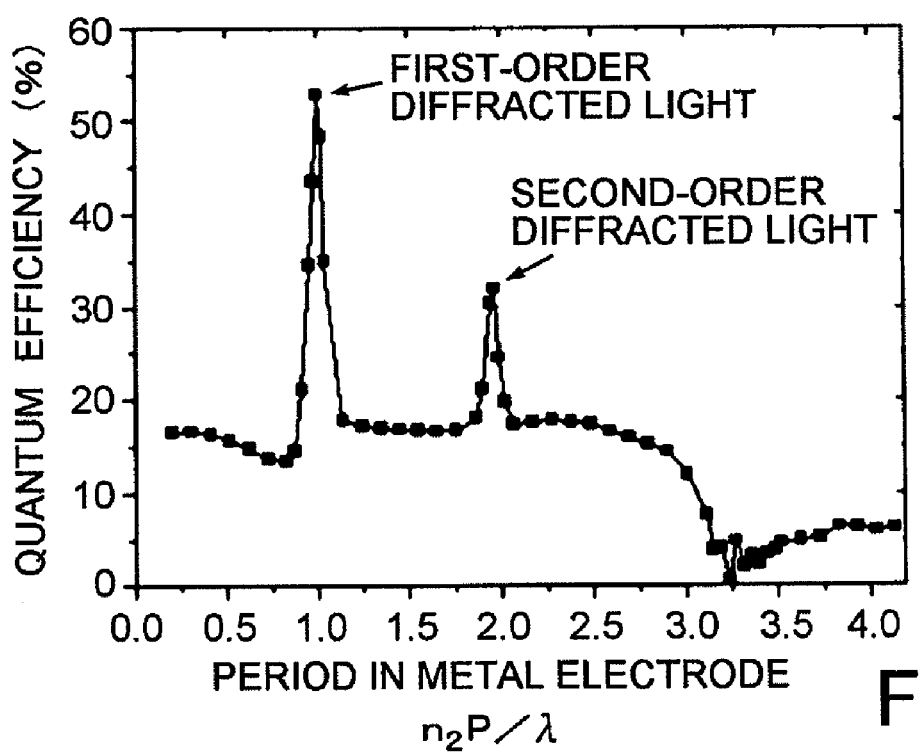
FIG. 2 is a graph showing the dependence of quantum efficiency on MSM electrode period P.

FIG. 2 is a graph showing the dependence of quantum efficiency of the photodiode on period P, in which the horizontal axis represents a normalized value of period P by $\lambda/n_2$ and the longitudinal axis represents quantum efficiency. Here, it is assumed that the incident light wavelength $\lambda$ is 1550 nm; a metal which constitutes MSM electrodes 1a, 1b is Au; the refractive index $n_1$ of the incident portion is 1; a material constituting upper spacer layer 2 is InAlAs (in this case, $n_2=3.21$); a material constituting light absorption layer 3 is InGaAS (in this case, $n_3=3.59$); a material constituting lower spacer layer 4 is InAlAs (in this case, $n_4=3.21$); thickness $T_1$ of MSM electrodes 1a, 1b is 300 nm; thickness $T_2$ of upper spacer layer 2 is 100 nm; and thickness $T_3$ of light absorption layer 3 is 250 nm. Although FIG. 2 shows that two peaks are present in quantum efficiency, they are respectively caused by first-order and second-order diffracted lights. The quantum efficiencies at the peaks are about 53% and 33%, respectively. In the range of $n_2P/\lambda<3.0$, the quantum efficiency of 15% at a portion away from the peaks is mostly caused by the contribution of zero-order diffracted light. Therefore, in order to improve quantum efficiency by using diffracted light, it is clear from FIG. 2 that period P in the metal periodic structure should be substantially equal to $\lambda/n_2$ or $2\lambda/n_2$. More specifically, it is preferable that a relation of $0.88<n_2P/\lambda<1.12$ is established when the first-order diffracted light is used and a relation of $1.85<n_2P/\lambda<2.15$ is established when the second-order diffracted light is used. The quantum efficiency is about 5% within the range of $n_2P/\lambda<3.2$. Since a value of $n_2P/\lambda$ in a general MSM photodiode is approximately above 3.2, the quantum efficiency of a general MSM photodiode is about 5%. That is, by using first-order diffracted light in the photodiode of this exemplary embodiment, the quantum efficiency can be increased about 10 times compared to a general MSM photodiode.

Figure 3:
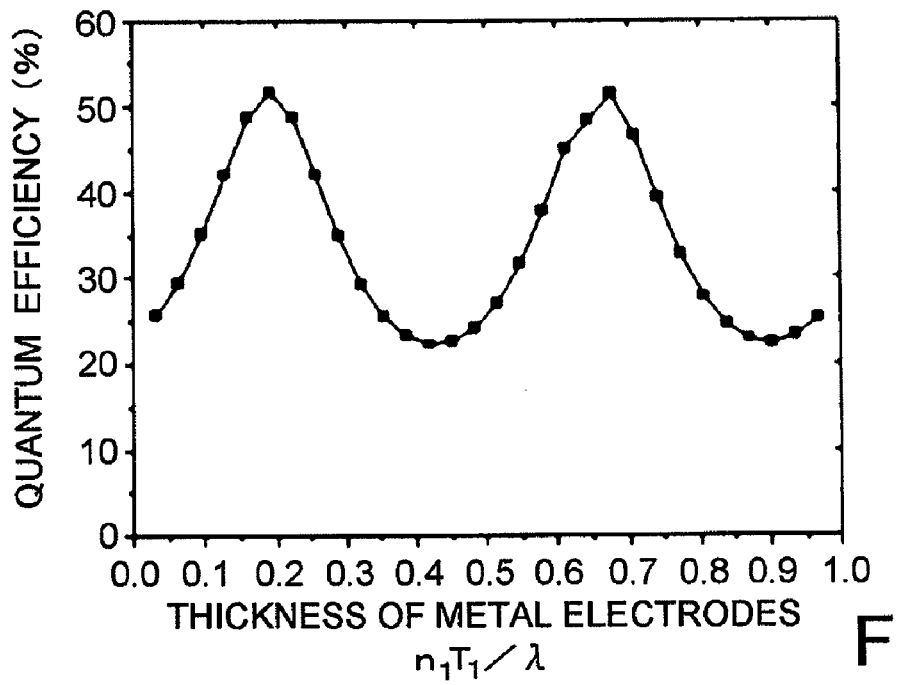
FIG. 3 is a graph showing the dependence of quantum efficiency on MSM electrode thickness $T_1$.

FIG. 3 is a graph showing the dependence of quantum efficiency of the photodiode on thickness $T_1$ of MSM electrodes 1a, 1b, in which the horizontal axis represents a normalized value of thickness $T_1$ by $\lambda/n_1$ and the longitudinal axis represents quantum efficiency. Here, materials constituting each layer and refractive indexes of each layer are the same as those in the example shown in FIG. 2. Period P is 480 nm, thickness $T_2$ of upper spacer layer 2 is 100 nm, and thickness $T_3$ of light absorption layer 3 is 250 nm. It is clear from FIG. 3 that the quantum efficiency changes periodically with thickness $T_1$ of the electrodes. This periodicity in quantum efficiency is considered to be caused by periodic changes in the reflectance and transmittance of light at the electrode portion due to the formation of a cavity for surface plasmon polaritons in a vertical direction, i.e., a direction perpendicular to the film surface of upper spacer layer 2, in waveguide portions of MSM electrode 1a, 1b. Such a cavity is formed between the incoming end of the waveguide portions, i.e., the surface position of the electrode at the side to which incident light enters, and the exit end of the waveguide portions, i.e., the interface position between the electrodes and upper spacer layer 2.

From FIG. 3, it is seen that, when m is an integer equal to or greater than zero (i.e., m=0, 1, 2, . . . ) and the relation of $$0.1+0.5m < n_1 T_1/\lambda < 0.3+0.5m$$

is satisfied, the reflectance of light at the electrode portion is reduced, a quantum efficiency of about 30% or more is obtained, and a preferable structure is thus achieved. However, from the viewpoint of manufacturing process, it is better that thickness $T_1$ of the electrodes is made as thin as possible to make manufacturing easier. Due to this, it is particularly preferable that the relation of $0.1 < n_1 T_1/\lambda < 0.3$, that is, the relation of m=0 in the above formula is satisfied.

Figure 4:
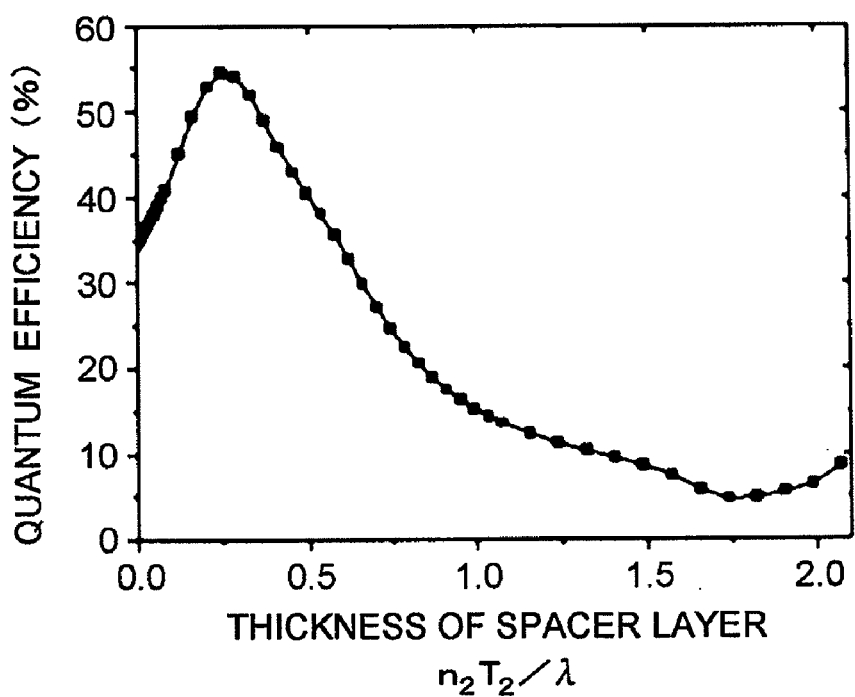
FIG. 4 is a graph showing the dependence of quantum efficiency on thickness $T_2$ of an upper spacer layer.

FIG. 4 is a graph showing the dependence of quantum efficiency of the photodiode on thickness $T_2$ of upper spacer layer 2, in which the horizontal axis represents a normalized value of thickness $T_2$ by $\lambda/n_2$ and the longitudinal axis represents quantum efficiency. Here, materials constituting each layer and refractive indexes of each layer are the same as those in the example shown in FIG. 2. Period P is 480 nm, thickness $T_1$ of MSM electrodes 1a, 1b is 300 nm, and thickness $T_3$ of light absorption layer 3 is 250 nm. It is clear from FIG. 4 that, when m is an integer equal to or greater than zero (i.e., m=0, 1, 2, . . . ) and the relation of $$n_2 T_2/\lambda < 0.5$$

is satisfied, a high quantum efficiency of about 35% or more is obtained and a preferable structure is achieved. When thickness $T_2$ of upper spacer layer 2 is substantially equal to $\lambda/4n_2$, the quantum efficiency is the highest and an quantum efficiency of about 53% is obtained. At this point, it is seen that a quantum efficiency is improved by about 20% compared to the case where there is no upper spacer layer 2, that is, $T_2=0$.

Figure 5:
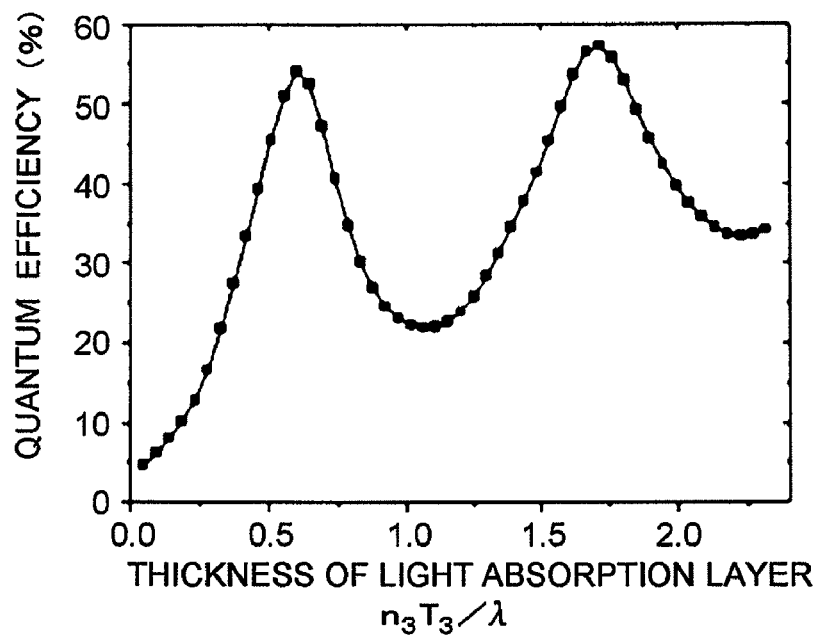
FIG. 5 is a graph showing the dependence of quantum efficiency on thickness $T_3$ of a light absorption layer.

FIG. 5 is a graph showing the dependence of quantum efficiency of the photodiode on thickness $T_3$ of light absorption layer 3, in which the horizontal axis represents a normalized value of thickness $T_3$ by $\lambda/n_3$ and the longitudinal axis represents quantum efficiency. Here, materials constituting each layer and refractive indexes of each layer are the same as those in the example shown in FIG. 2. Period P is 480 nm, thickness $T_1$ of MSM electrodes 1a, 1b is 300 nm, and thickness $T_2$ of upper spacer layer 2 is 100 nm. From FIG. 5, it is seen that, when m is an integer equal to or greater than zero (i.e., m=0, 1, 2, . . . ) and the relation of $$0.4+m < n_3 T_3/\lambda < 0.6+m$$

is satisfied, a high quantum efficiency is obtained and a preferable structure is achieved. More preferably, when thickness $T_3$ of light absorption layer is substantially equal to $\lambda/2n_3$, a quantum efficiency of about 50% is obtained. Moreover, at this point, since light absorption layer 3 is thin and the transit time of photocarriers can be shortened, a high-speed and high-efficiency photodiode is achieved.

As described above, in the MSM photodiode of this exemplary embodiment, an optical waveguide is constituted by disposing upper spacer layer 2 and lower spacer layer 4 respectively on and under light absorption layer 3 made of a semiconductor, and MSM electrodes 1a, 1b constituting a metal periodic structure capable of inducing surface plasmon is provided on the surface of upper spacer layer 2. MSM electrodes 1a, 1b have portions arranged alternately to each other. Incident light is coupled with a surface plasmon propagated along the waveguide portion of MSM electrodes 1a, 1b. By forming a cavity of surface plasmon polaritons between the incident end and exit end of MSM electrodes 1a, 1b, reflection can be reduced, and optical energy of incident light can be efficiently guided into light absorption layer 3. By providing upper spacer layer 2, the coupling efficiency of diffracted light to the optical waveguide is increased.

Hereinafter, an example of the MSM photodiode according to the first exemplary embodiment will be described.

EXAMPLE 1

Figure 6:
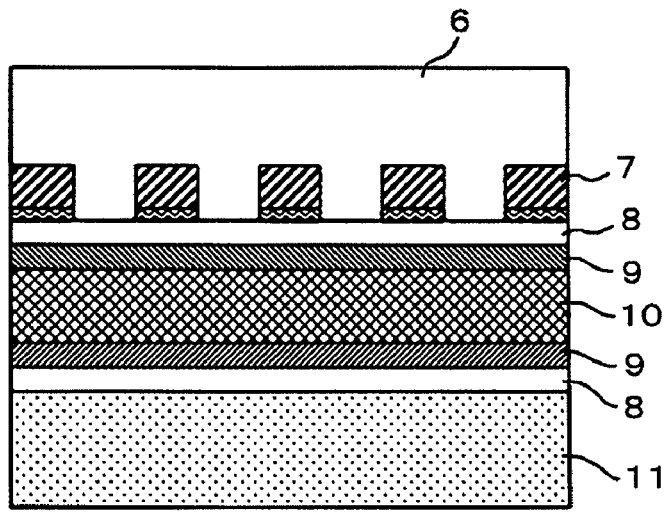
FIG. 6 is a sectional view showing the configuration of an MSM photodiode of Example 1.
Figure 7:
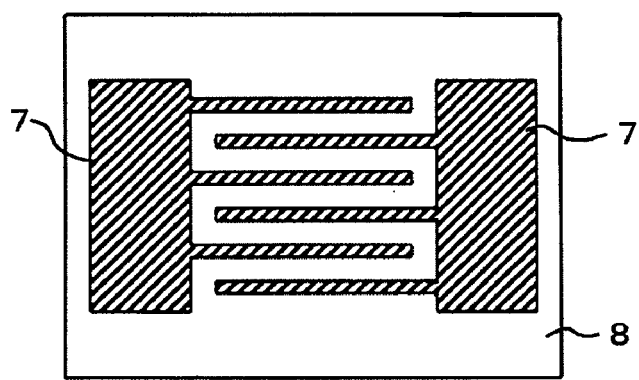
FIG. 7 is a plan view showing the configuration of the MSM photodiode of Example 1.

FIGS. 6 and 7 are a sectional view and a plan view, respectively, showing the configuration of one example of the MSM photodiode of the first exemplary embodiment. In this MSM photodiode, InAlAs layer 8, which is to be a lower spacer layer, is formed on InP substrate 11; InGaAs layer 10, which is to be a light absorption layer, is formed on InAlAs layer 8 with graded layer 9 interposed therebetween; another InAlAs layer 8, which is to be an upper spacer layer, is formed on InGaAs layer 10 with another graded layer 9 interposed therebetween; and Ti/Au electrodes 7 acting as a pair of MSM electrodes which are a metal periodic structure are formed on InAlAs layer 8 as the upper spacer layer. And then $SiO_2$ film 6 as an antireflection film is formed to cover the entirety of Ti/Au electrodes 7 and InAlAs layer 8 acting as the upper spacer layer. Graded layer 9 refers to a layer which is formed between InAlAs layer 8 and InGaAs layer 10 and whose composition changes in a stepwise fashion in order to realize matching between these layers 8, 10. All of these layers 8 to 10 each made of a compound semiconductor can be grown on InP substrate 11 by molecular beam epitaxy. A good Schottky barrier junction is formed at the interface between InAlAs layer 8 at the upper side and Ti/Au electrodes 7, and this leads to the depletion of InGaAs layer 10 acting as the light absorption layer. When the incident light wavelength is, for example, 1.3 μm or 1.55 μm used for optical communication, InGaAs has a sufficiently high absorption coefficient. Therefore, according to this configuration, a high-efficiency photodiode can be realized.

Meanwhile, in the photodiode of Example 1, comb-like electrodes as shown in FIG. 7 are used, and the quantum efficiency of this photodiode depends on the polarization direction of incident light. With the use of this polarization dependence, it is possible to perform polarization-selective light reception for detecting incident light having a specific polarization.

EXAMPLE 2

Figure 8:
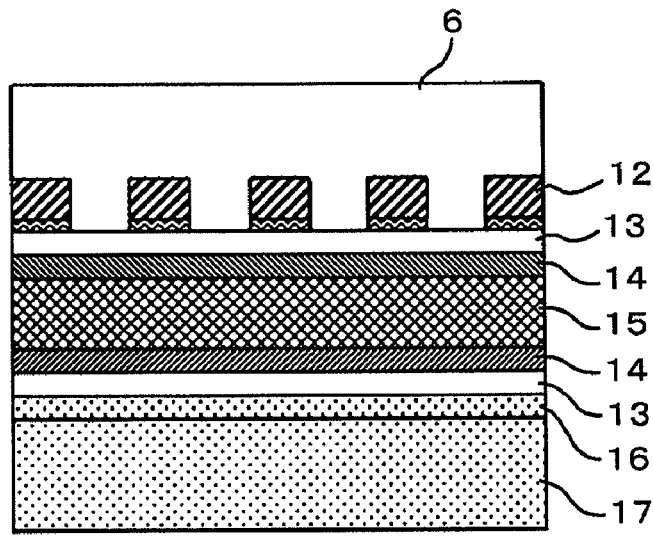
FIG. 8 is a sectional view showing the configuration of an MSM photodiode of Example 2.

Although an MSM photodiode of Example 2 as shown in FIG. 8 is based on the first exemplary embodiment, a semiconductor material used for the MSM photodiode of Example 2 is different from that used for the MSM photodiode of Example 1 as shown in FIG. 6. In the photodiode of Example 2, Si layer 13, which is to be a lower spacer layer, is formed on Si substrate 17 including buried oxide layer 16; Ge layer 15, which is to be a light absorption layer, is formed on Si layer 13 with SiGe buffer layer 14 interposed therebetween; another Si layer 13, which is to be an upper spacer layer, is formed thereon with another SiGe buffer layer 14 interposed therebetween; and Cr/Ag electrodes 12 acting as a pair of MSM electrodes, which are the metal periodic structure, are formed on Si layer 12 as the upper spacer layer. And then $SiO_2$ film 6 as an antireflection film is formed to cover the entirety of Cr/Ag electrodes 12 and Si layer 13 acting as the upper spacer layer. It is generally difficult to directly form a Ge layer on the Si layer by epitaxial growth. However, in this example, a Ge layer can grow expitaxially by firstly forming SiGe layer 14 on Si layer 13. A good Schottky barrier junction is formed at the interface between Si layer 13, which is to be an upper space layer, and Cr/Ag electrodes 12, and this leads to the depletion of Ge layer 5. The photodiode using Ge layer 15 as a light absorption layer as described above, too, operates with respect to incident light having a wavelength of 1.3 μm or 1.55 μm. In this wavelength band, Si is a transparent material having no absorbency. With the use of Ge layer 15 as the light absorption layer, there is an advantage that the manufacture of the photodiode can achieve better conformity to the fabrication processes of Si semiconductor devices.

EXAMPLE 3

Figure 9:
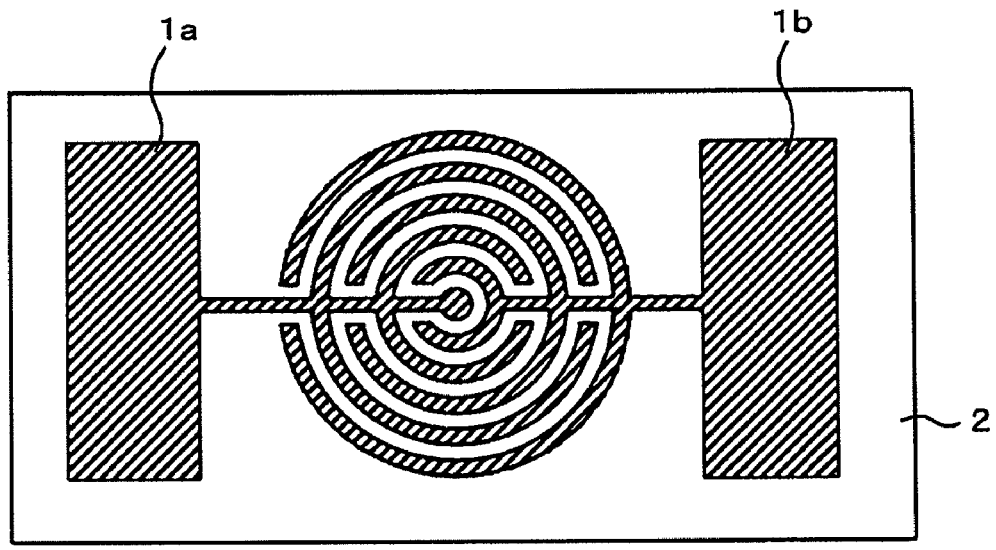
FIG. 9 is a plan view showing the configuration of an MSM photodiode of Example 3.

While MSM photodiode of Example 3 as shown in FIG. 9, which is based on the first exemplary embodiment, has the same lamination structure as that of the photodiode of Example 1 as shown in FIG. 7, the MSM photodiode of Example 3 is different from that of Example 1 in terms of a planar structure of MSM electrodes 1a, 1b. That is, MSM electrodes 1a, 1b are formed to have a concentric periodic structure in the photodiode of Example 3.

In the photodiode of Example 1 as shown in FIG. 7, MSM electrodes have a slit array structure, i.e., a stripe structure, in the light receiving portion thereof, and this leads to polarization dependence. However, in the photodiode of Example 3, MSM electrodes are arranged to have a concentric periodic structure, polarization dependence can be eliminated. Accordingly, it is possible for the photodiode of Example 3 to achieve high quantum efficiency to unpolarized incident light such as light exiting from an optical fiber.

Second Exemplary Embodiment

Figure 10:
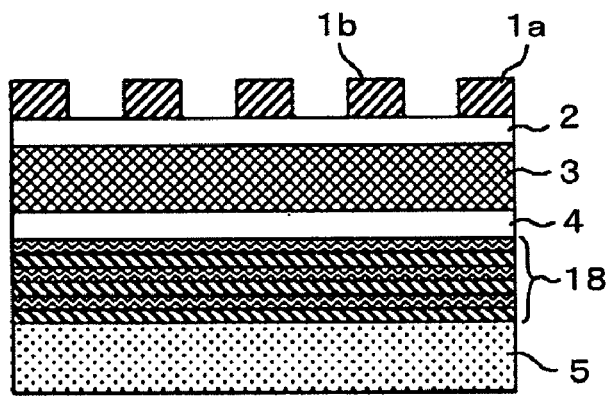
FIG. 10 is a sectional view showing the configuration of an MSM photodiode according to a second exemplary embodiment of the present invention.

FIG. 10 shows a cross-sectional configuration of an MSM photodiode according to a second exemplary embodiment. The difference of the photodiode as shown in FIG. 10 from the photodiode of the first exemplary embodiment as shown in FIG. 1 is that a reflection structure such as Bragg reflection multilayer film 18 is formed under light absorption layer 3, more concretely, in a lamination surface between lower spacer layer 4 and substrate 5.

The MSM photodiode being described in this Description improves quantum efficiency by confining diffracted light diffracted by a metal periodic structure in light absorption layer 3. However, in reality, as light incident to light absorption layer 3, zero-order diffracted light, i.e., light transmitted without diffraction, as well as diffracted light, exists. The photodiode of the second exemplary embodiment is configured such that, by forming a reflection structure, such as Bragg reflection multilayer film 18, under light absorption layer 3, the zero-order transmission component transmitted through light absorption layer 3 is reflected by the reflection structure and returned back to light absorption layer 3, and further is affected by a diffraction effect from MSM electrodes 1a, 1b and confined in the waveguide layer. As a result, according to the second exemplary embodiment, the quantum efficiency of the photodiode can be further increased compared to the first exemplary embodiment. At this point, if the reflectance of Bragg reflection multilayer film 18 is 100%, the quantum efficiency of the photodiode is about 90% or higher.

EXAMPLE 4

Figure 11:
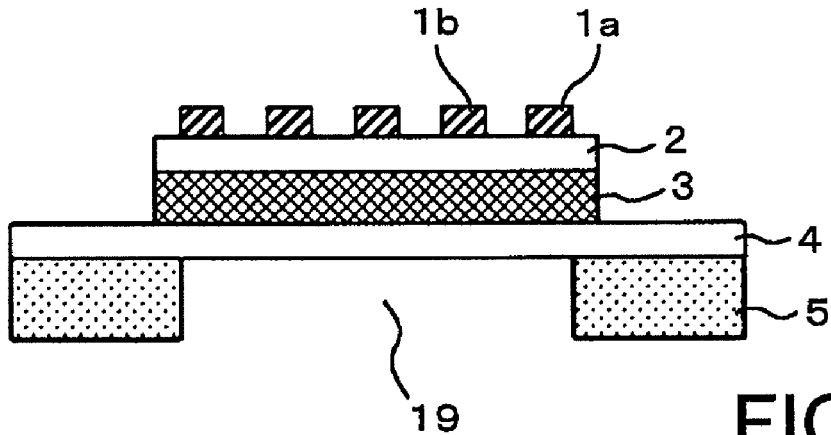
FIG. 11 is a plan view showing the configuration of an MSM photodiode of Example 4.

An MSM photodiode of Example 4 as shown in FIG. 11 is based on the second exemplary embodiment. In this photodiode, instead of forming Bragg reflection multilayer film 18 in the configuration as shown in FIG. 10, cutout window 19 is formed by etching the backside of substrate 5, i.e., the underside as shown in the drawing, in a region corresponding to at least the light receiving portion of the photodiode. In a position where cutout window 19 is formed, the bottom surface of lower spacer layer 4 is exposed. Of cutout window 19, a cutout portion of the substrate is made of an air layer, so that the difference in refractive index with lower spacer layer 4 becomes larger, thus increasing the reflectance at this interface. Therefore, the quantum efficiency of the photodiode can be increased by a reflection structure using a cutout window. Further, a metal mirror is formed in cutout window 19 from the underside as shown in the drawing so as to come in contact with lower spacer layer 4, thereby further increasing the reflectance.

Third Exemplary Embodiment

Figure 12:
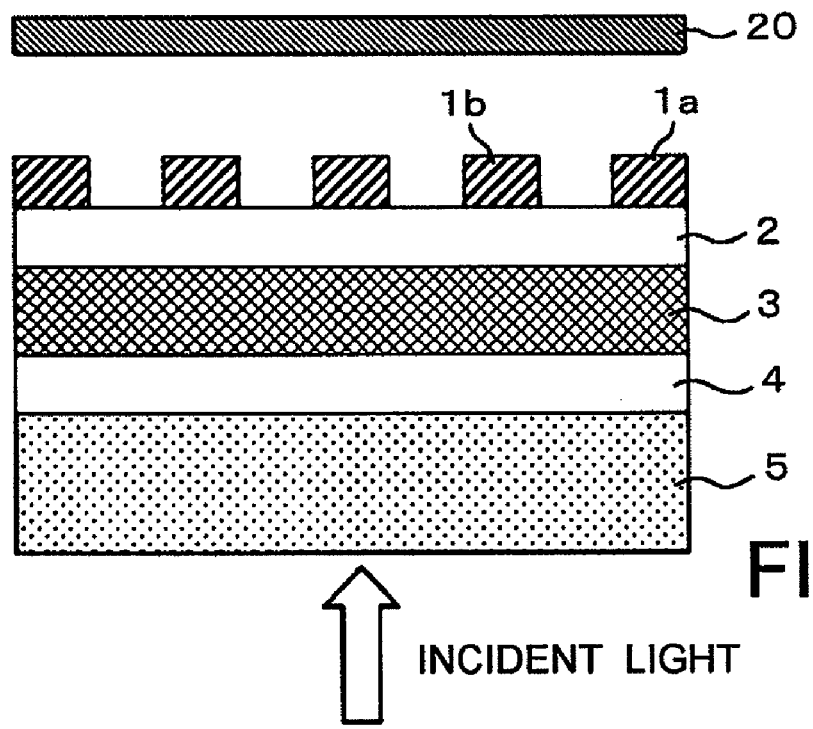
FIG. 12 is a sectional view showing the configuration of an MSM photodiode according to a third exemplary embodiment of the present invention.

FIG. 12 shows a cross-sectional configuration of an MSM photodiode according to a third exemplary embodiment of the present invention. The difference of the photodiode as shown in FIG. 12 from the photodiode of the first exemplary embodiment as shown in FIG. 1 is that, assuming use of substrate 5 transparent with respect to incident light, light is incident from substrate 5 and metal mirror 20 is disposed above MSM electrodes 1a, 1b. By making light incident from substrate 5, it is possible to prevent the quantum efficiency from being lowered as the incident light is reflected by electrodes 1a, 1b before it reaches light absorption layer 3. Moreover, since even a component transmitted through MSM electrodes 1a, 1b without being absorbed in the light absorption layer 3 can be reflected by metal mirror 20 and returned back to light absorption layer 3, it is possible to improve quantum efficiency up to about 90% or more. Instead of providing metal mirror 20, a Bragg reflection multilayer film may be disposed on MSM electrodes 1a, 1b.

Fourth Exemplary Embodiment

Figure 13:
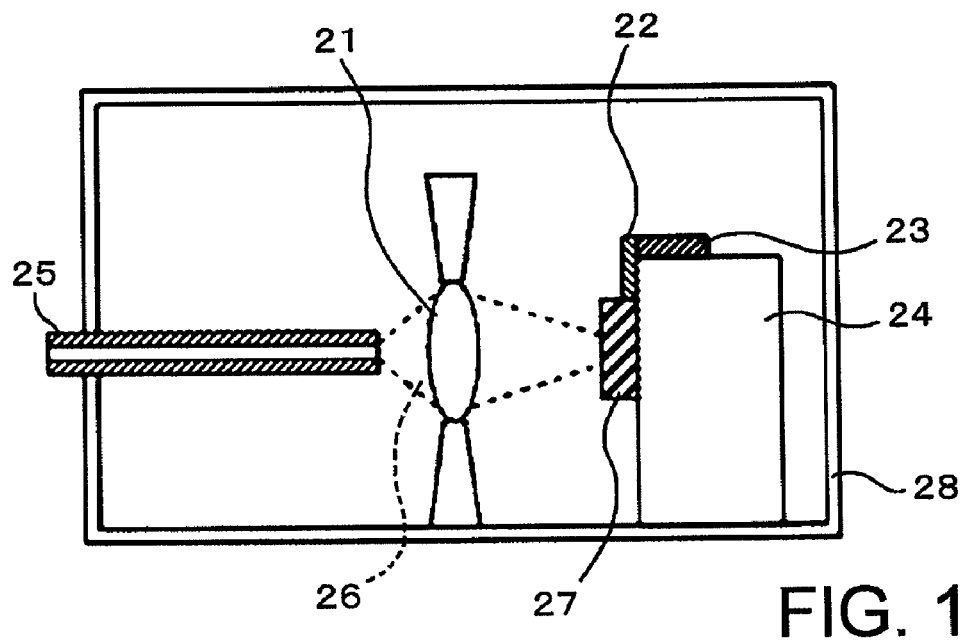
FIG. 13 is a sectional view showing a light receiving module for 40 Gbps transmission according to a fourth exemplary embodiment of the present invention on which the photodiode based on the present invention is mounted.

Next, examples of the application for various purposes of an MSM photodiode based on the present invention will be described. FIG. 13 shows a light receiving module for 40 Gbps (giga-bits per second) transmission using the photodiode.

Optical fiber 25 is led from the outside into module housing 28. In module housing 28, photodiode 27 is arranged to confront the end surface of optical fiber 25, and lens 21 optically coupling optical fiber 25 and photodiode 27 to focus signal light 26 emitted from optical fiber 25 upon the light receiving surface of photodiode 27 is provided between the end surface of optical fiber 25 and photodiode 27. As photodiode 27, ones based on each of the above-described exemplary embodiments can be used. Photodiode 27 is provided on the side surface of chip carrier 24 and is connected by way of electrical wiring 22 to preamplifier IC (integrated circuit) 23 that is provided on the upper surface of chip carrier 24. Photodiode 27 converts signal light 26 to electrical signals, and supplies the electrical signals to preamplifier IC 23 by way of electrical wiring 22. Preamplifier IC 23 amplifies the electrical signals that have been applied as input.

When such a light receiving module is used in signal transmission by near-infrared light having a wavelength of 1.55 μm, photodiode 27 is a photodiode that uses a semiconductor substrate obtained by epitaxial growth of Ge on Si, or a compound semiconductor substrate can be used. An MSM photodiode generally has smaller device capacitance than a pin type, so that the light receiving area can be increased by the use of the above-described photodiode, while maintaining a high-speed response, compared to the case of using a pin type photodiode. As a result, a coupling tolerance can be made larger in the optical coupling between the optical fiber and the photodiode.

Fifth Exemplary Embodiment

Figure 14:
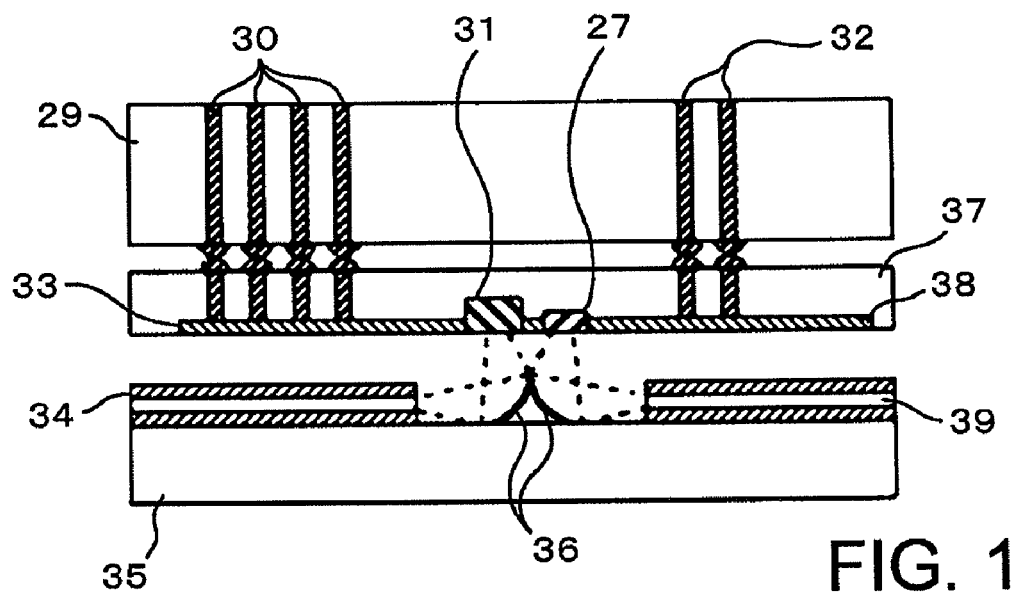
FIG. 14 is sectional view of an inter-LSI-chip interconnection module according to a fifth exemplary embodiment of the present invention in which the photodiode based on the present invention is mounted.

Next, another example of the application of an MSM photodiode based on the present invention will be described. FIG. 14 shows an optical interconnection module in which the photodiode based on the present invention is mounted. This optical interconnection module is used for performing signal transmission by optical signals between LSI (large scale integrated circuit) chips.

The interconnection of LSIs by optical fibers and the signal transmission by optical signals are being investigated as a means of transmitting signals at high speed between LSIs mounted on a wiring board. Signal processing within LSI is carried out for electrical signals and an optical interconnection module is therefore required for realizing connection between optical fibers and each of the LSI chips. The optical interconnection converts signal light from optical fibers to electrical signals for input to an LSI chip, and converts electrical signals supplied from LSI chips to light signals and introduces these signals to fibers.

On one surface of mounting board 37 for mounting a photodiode and a light source, photodiode 27 and VCSEL (Vertical Cavity Surface Emitting Laser) light source 31 with an electric modulation mechanism are provided. As photodiode 27, for example, ones based on each of the above-described exemplary embodiments can be used. Mounting board 37 is attached to the surface of LSI package 29 that incorporates an LSI chip. Electrical wiring vias 30 for the light source and modulation and electrical wiring vias 32 for the photodiode are formed in LSI package 29. Electrical wiring vias 30 for the light source and modulation are formed in mounting board 37 and are connected to electrical wiring layer 33 that is connected to VCSEL light source 31. Electrical wiring vias 32 for photodiode are also formed in mounting board 37, and are connected to electrical wiring layer 38 connected to photodiode 27.

Mounting board 35 on which an LSI is mounted 35 is arranged to confront mounting board 37 on which the photodiode and the light source are mounted. The surface of LSI mounting board 35 is provided with: optical fiber 39 for optical signal input, optical fiber 34 for optical signal output; concave mirror 36 for directing signal light emitted from the end surface of input optical fiber 39 toward photodiode 27; and concave mirror 36 for making signal light from VCSEL light source 31 incident to output optical fiber 34. Concave mirrors 36 optically couple optical fiber 39 and photodiode 27 and optically couple optical fiber 34 and VCSEL light source 31.

In this type of configuration, an optical signal from optical fiber 39 is irradiated onto photodiode 27 by concave mirror 36, and a current corresponding to the optical signal is flown to the LSI through electrical wiring layer 38. Alternatively, well known methods other than an optical fiber, such as a planar optical waveguide, can be used for input of an optical signal. Moreover, light concentrating mechanism other than concave mirror 36, such as a convex lens, can also be used. Furthermore, a preamplifier for amplifying an electrical signal can be provided midway through electrical wiring layer 38 at a position that immediately follows photodiode 27.

Electrical signals from LSI pass from electrical wiring vias 30 and through electrical wiring layer 33 to be converted to optical signals by VCSEL light source 31. The optical signal is reflected by concave mirror 36 and sent to optical fiber 34. VCSEL light source 31 can be replaced with other known mechanisms that modulate light through electricity, such as, a Mach-Zehnder type modulator, which modulates light emitted from an external light source through an electro-optical effect or thermal optical effect.

In accordance with the fifth exemplary embodiment, a high-speed and high-efficiency photodiode can be realized by using Ge having good affinity with a CMOS process of an Si semiconductor device, thus achieving a high degree of integration, and mass production is made easier, thus reducing the manufacturing cost. That is, in an optical interconnection module, an LSI electronic circuit can be easily formed monolithically with the Si substrate on which the photodiode is formed.

In another exemplary embodiment of the present invention, it is preferred that, in the photodiode, an optical waveguide for coupling light diffracted by a metal period structure is comprised of an upper spacer layer, a light absorption layer, and a lower spacer layer. By this configuration, the generation efficiency of diffracted light can be increased.

In a photodiode of still another exemplary embodiment, as first and second electrodes composed of a metal periodic structure, for example, comb-like electrodes in which their electrode finger portions are alternately arranged, or concentric metal electrodes in which their arc-shaped electrode finger portions are alternately arranged, can be used. In these cases, it is preferred that a gap between the electrode finger of the first electrode and the electrode finger of the second electrode is regular. The period of the electrode fingers in this alternate arrangement is referred to as period P in the metal periodic structure. In the case when focus is only on the electrode fingers of the first electrode or in the case when focus is only on the electrode fingers of the second electrode, the period is referred to as 2P.

In the photodiode of each of the above-described exemplary embodiments, incident light is coupled to a surface plasmon propagated along waveguide portions of the metal periodic structure. A decrease in reflection of the incident light is enabled by adjusting the thickness of the metal periodic structure and having a structure in which a cavity of surface plasmon polaritons is formed between the incident end and exit end of the waveguide portions, thereby efficiently guiding the optical energy of the incident light into the semiconductor layer. Moreover, the generation efficiency of diffracted light having such a wave number as to be coupled to the optical waveguide comprised of a light absorption layer can be increased by adjusting the period of the metal periodic structure. Along with this, an upper spacer layer composed of a semiconductor layer which does not absorb light is formed between the first and second electrodes and the light absorption layer, and the thickness thereof is set to an optimal value to be described later, thereby further increasing the coupling efficiency between diffracted light and an optical waveguide.

This application claims a priority based on Japanese Patent Application No. 2006-337035 filed on Dec. 14, 2006, the entire contents of which are incorporated herein by reference.

The invention claimed is:

1. A photodiode, comprising:
   an upper spacer layer comprising a semiconductor transparent to incident light;
   a metal periodic structure provided on said upper spacer layer and arranged to induce surface plasmon, said metal periodic structure including first and second electrodes including finger portions arranged alternately on said upper spacer layer such that the first electrode and the second electrode are arranged in an interdigitated manner;
   a light absorption layer formed under said upper spacer layer and comprising a semiconductor having a refractive index higher than that of said upper spacer layer; and
   a lower spacer layer formed under said light absorption layer and having a refractive index smaller than that of said light absorption layer,
   wherein each of said first and second electrodes forms a Schottky barrier junction with said upper spacer layer, and
   wherein said metal periodic structure has a concentric periodic structure.

2. The photodiode according to claim 1, wherein an optical waveguide for coupling light diffracted by said metal periodic structure is formed by said upper spacer layer, said light absorption layer and said lower spacer layer.

3. The photodiode according to claim 2, wherein a cavity of surface plasmon polaritons is formed in a direction perpendicular to said light absorption layer in waveguide portions of said metal periodic structure.

4. The photodiode according to claim 1, wherein, when $\lambda$ is a wavelength of said incident light in vacuum, $n_1$ is a refractive index of an incident portion on which said incident light is incident to said photodiode, and $T_1$ is a thickness of said metal periodic structure, condition of $0.1+0.5m<n_1 T_1/\lambda<0.3+0.5m$ is established where m is an integer equal to or greater than zero.

5. The photodiode according to claim 1, wherein, when $\lambda$ is a wavelength of said incident light in vacuum and $n_2$ is a refractive index of said upper spacer layer, a period P of a periodic structure in said metal period structure is substantially equal to $\lambda/n_2$ or $2\lambda/n_2$.

6. The photodiode according to claim 1, wherein, when $\lambda$ is a wavelength of said incident light in vacuum, $n_2$ is a refractive index of said upper spacer layer, and P is a period of a periodic structure in said metal period structure, any one of the following conditions:
   (a) $0.88<n_2 P/\lambda<1.12$; and
   (b) $1.85<n_2 P/\lambda<2.15$
   is established.

7. The photodiode according to claim 1, wherein when $\lambda$ is a wavelength of said incident light in vacuum and $n_2$ is a refractive index of said upper spacer layer, thickness $T_2$ of said upper spacer layer is substantially equal to $\lambda/4n_2$.

8. The photodiode according to claim 1, wherein, when $\lambda$ is a wavelength of said incident light in vacuum, $n_2$ is a refractive index of said upper spacer layer, and $T_2$ is a thickness of said upper spacer layer, condition of $n_2 T_2/\lambda<0.5$ is established.

9. The photodiode according to claim 1, wherein, when $\lambda$ is a wavelength of said incident light in vacuum and $n_3$ is a refractive index of said light absorption layer, thickness $T_3$ of said light absorption layer is substantially equal to $\lambda/2n_3$.

10. The photodiode according to claim 1, wherein, when $\lambda$ is a wavelength of said incident light in vacuum, $n_3$ is a refractive index of said light absorption layer, and $T_3$ is a thickness of said light absorption layer, m is an integer equal to or greater than zero and condition of $0.4+m<n_3 T_3/\lambda<0.6+m$ is established.

11. The photodiode according to claim 1, wherein a Bragg reflection multilayer film is formed under said lower spacer layer.

12. The photodiode according to claim 1, further comprising a substrate formed under said lower spacer layer to support said lower spacer layer, wherein said substrate includes an aperture passing through said substrate formed to correspond to a region in which said incident light is absorbed.

13. The photodiode according to claim 12, wherein a mirror is formed in a position of said aperture to reflect a light transmitted through said lower spacer layer from said light absorption layer.

14. The photodiode according to claim 1, wherein a mirror structure is formed above said metal periodic structure to reflect a light incident to said light absorption layer from said lower spacer layer and transmitted through said light absorption layer and said metal periodic structure.

15. The photodiode according to claim 1, wherein at least one of said upper spacer layer, said light absorption layer and said lower spacer layer includes a laminated structure made of a plurality of materials including a graded layer.

16. An optical communication device comprising a photodiode according to claim 1 provided in a light receiving portion.

17. An optical interconnection module, comprising:
   an Si substrate on which a photodiode according to claim 1 is formed; and
   an LSI electronic circuit formed on said Si substrate to be monolithic with said photodiode.

* * * * *